United States Patent [19]

Miedema

[11] 4,048,559

[45] Sept. 13, 1977

[54] METHOD AND APPARATUS FOR TESTING MICROWAVE REPEATERS FOR IM DISTORTION

[75] Inventor: Hotze Miedema, Boxford, Mass.

[73] Assignee: Bell Telephone Laboratories, Incorporated, Murray Hill, N.J.

[21] Appl. No.: 756,959

[22] Filed: Jan. 5, 1977

[51] Int. Cl.² .............................................. G01R 29/00
[52] U.S. Cl. .............................. 324/57 SS; 324/58 A; 324/57 DE
[58] Field of Search ............ 324/57 DE, 57 SS, 57 H, 324/58 A; 325/67; 331/178

[56] References Cited

U.S. PATENT DOCUMENTS

| | | | |
|---|---|---|---|
| 2,685,062 | 7/1954 | Schroeder et al. | 324/57 SS |
| 2,929,989 | 3/1960 | Hurvitz | 324/57 H |
| 3,032,712 | 5/1962 | Hurvitz | 324/57 H |
| 3,119,062 | 1/1964 | Codd | 324/58 A |
| 3,182,254 | 5/1965 | Feldman et al. | 324/57 H |
| 3,241,059 | 3/1966 | Wu | 324/57 H |
| 3,369,176 | 2/1968 | Palatinus | 324/57 H |
| 3,411,079 | 11/1968 | Palatinus | 324/57 SS |
| 3,411,080 | 11/1968 | Palatinus | 324/57 SS |

*Primary Examiner*—John Kominski
*Attorney, Agent, or Firm*—Bryan W. Sheffield

[57] ABSTRACT

Microwave repeaters and the like are tested for third-order IM distortion by applying two, swept-frequency test-tones to the repeater. The test-tones are offset by a fixed frequency difference $\delta$. A detector circuit, connected to the output of the repeater, measures the amplitude of any signal component of frequency $2\delta$ which is a direct measure of the repeater's non-linearity. Because a signal component of frequency $2\delta$ can be generated by second-order distortion within the detector itself, the detector includes special circuitry to cancel out any such unwanted term.

14 Claims, 2 Drawing Figures

METHOD AND APPARATUS FOR TESTING MICROWAVE REPEATERS FOR IM DISTORTION

BACKGROUND OF THE INVENTION a. Field of the Invention

Broadly speaking, this invention relates to the measurement of distortion. More particularly, in a preferred embodiment, this invention relates to methods and apparatus for measuring the intermodulation distortion generated by microwave repeaters, and the like.

b. Discussion of the Prior Art

Multi-channel, microwave transmission systems employing suppressed-carrier, single-sideband, amplitude-modulation have been proposed as a replacement for existing frequency-modulation systems. Due to the nature of amplitude-modulation, such systems will be more sensitive to non-linearities in the microwave repeaters than are the FM systems, for example. Of particular concern are third-order IM distortion products which tend to fall within the passband of the transmission system and, hence, are potentially troublesome.

The classic SMPTE method for measuring the IM distortion of audio amplifiers calls for the application to the amplifier's input of two fixed frequency test-tones, usually 400 Hz and 1000 Hz, and then examination of the amplifier's output for intermodulation products of frequencies such as 600 Hz, 1400 Hz, etc.

This classic approach may also be used with radio frequency and microwave amplifiers but the results that it yields are not too informative, due to the broad bandwidth of the devices under test. Accordingly, it is known to measure the non-linearity of such devices by applying to the amplifier two test-tones, $f_1$, $f_2$, of selectively adjustable frequency. In U.S. Pat. Nos. 3,411,080 and 3,369,176, for example, which respectively issued on Nov. 12 and Feb. 3, 1968, to A. O. Palatinus, the two test-tones are offset by a fixed frequency difference $\Delta f$, and the degree of distortion present in the amplifier's output signal determined by examining the magnitude of harmonics and subharmonics, $(M\Delta f)/2$; $M = 1,2,3 \ldots$, of the offset frequency $\delta f$. See also U.S. Pat. No. 3,241,059, to W. I. Wu.

The circuitry disclosed by Patatinus is complicated, expensive, and difficult to align.

SUMMARY OF THE INVENTION

Fortunately, I have discovered that Patatinus' approach can be modified to yield a far more practical measurement technique, ideally suited for checking microwave repeaters for third-order IM distortion products. According to my invention, two swept test-tones, $f_1$ and $f_2$, which are offset by a constant frequency difference $\delta$, are applied to the input of the repeater under test. A detector connected to the repeater's output measures the amplitude of any signal component of frequency $2\delta$, which I have found to be a direct measure of the non-linearity of the repeater under test. Because signals of frequency $2\delta$ can also be generated within the detector, an important aspect of my invention is the circuitry employed for the detector, which circuitry is especially configured to cancel out any $2\delta$ term generated within the detector itself.

The invention and its mode of operation will be more fully understood from the following detailed description, when taken with the appended drawings, in which:

DETAILED DESCRIPTION OF THE INVENTION

Figure 1:
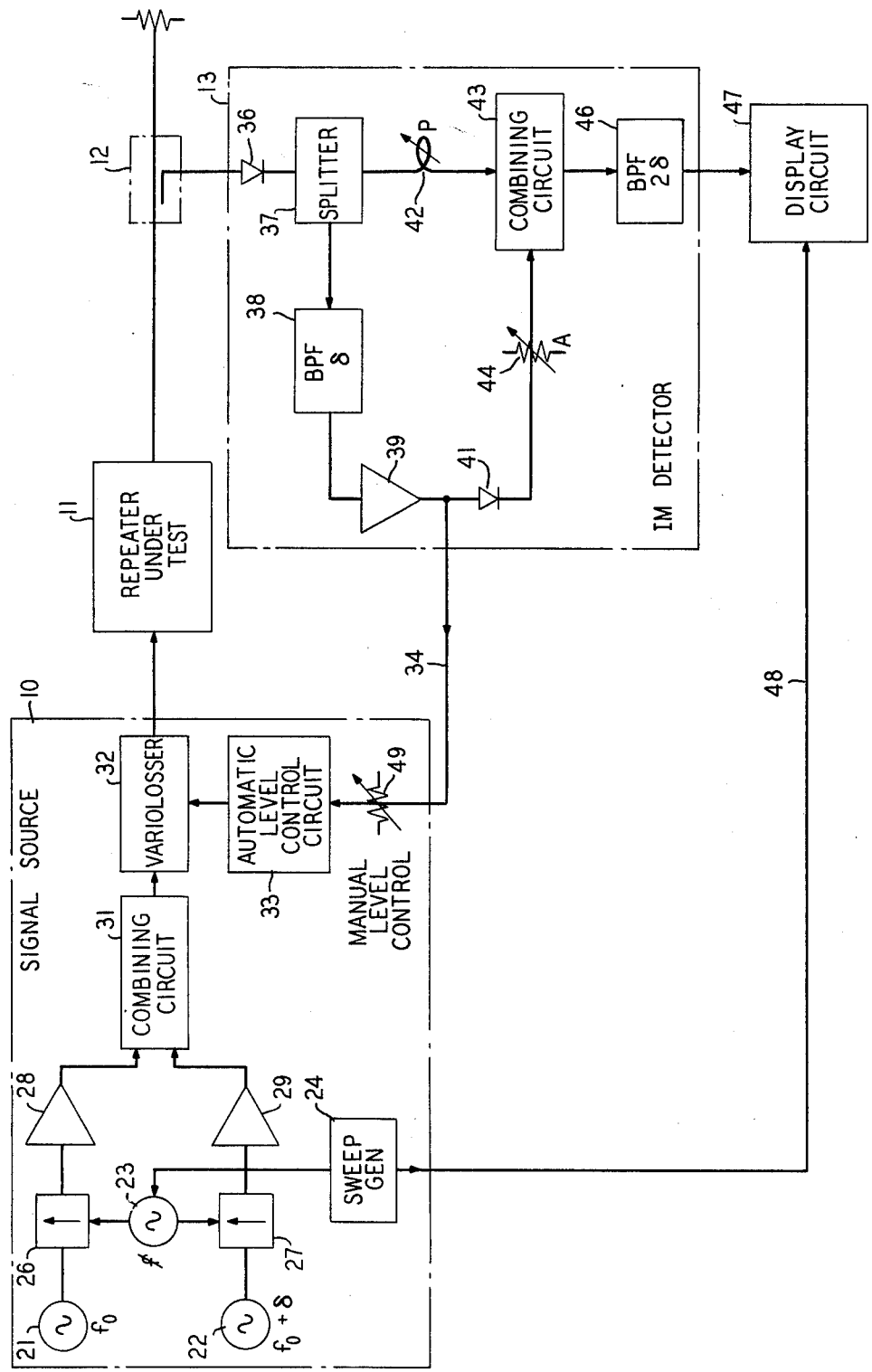
FIG. 1 is a block schematic of an illustrative distortion measuring circuit according to the invention.

FIG. 1 depicts an illustrative embodiment of the invention. As shown therein, a signal source 10 is connected to the input of a repeater 11 and applies a plurality of test signals thereto. A coupler 12, connected to the output of the repeater, connects a portion of the output signal to an IM detector 13.

More specifically, signal source 10 comprises a first oscillator 21 having an output signal of frequency $f_o$ and a second oscillator 22 having an output signal of frequency $(f_o + \delta)$. A variable frequency oscillator 23 connected to, and controlled by, a sweep generator 24 generates the swept signal of frequency $f$.

The swept frequency signal $f$ from oscillator 23 is combined with the output from oscillator 21 in a mixer 26 to thereby generate a first test signal of frequency $(f_o + f)$. In like fashion, the output from oscillator 22 is combined with the output from oscillator 23 in a mixer 27 to produce a second test signal of frequency $(f_o + \delta + f)$. The two test signals are then amplified in amplifiers 28 and 29, respectively, and combined in a combining circuit 31 for application to the repeater under test. The level of the signal from combining circuit 31 is controlled by a variolosser circuit 32 which is driven by the output of an automatic level control circuit 33. As will be explained below, level control circuit 33 is connected to, and controlled by, an output signal from detector 13, over a lead 34.

Figure 2:
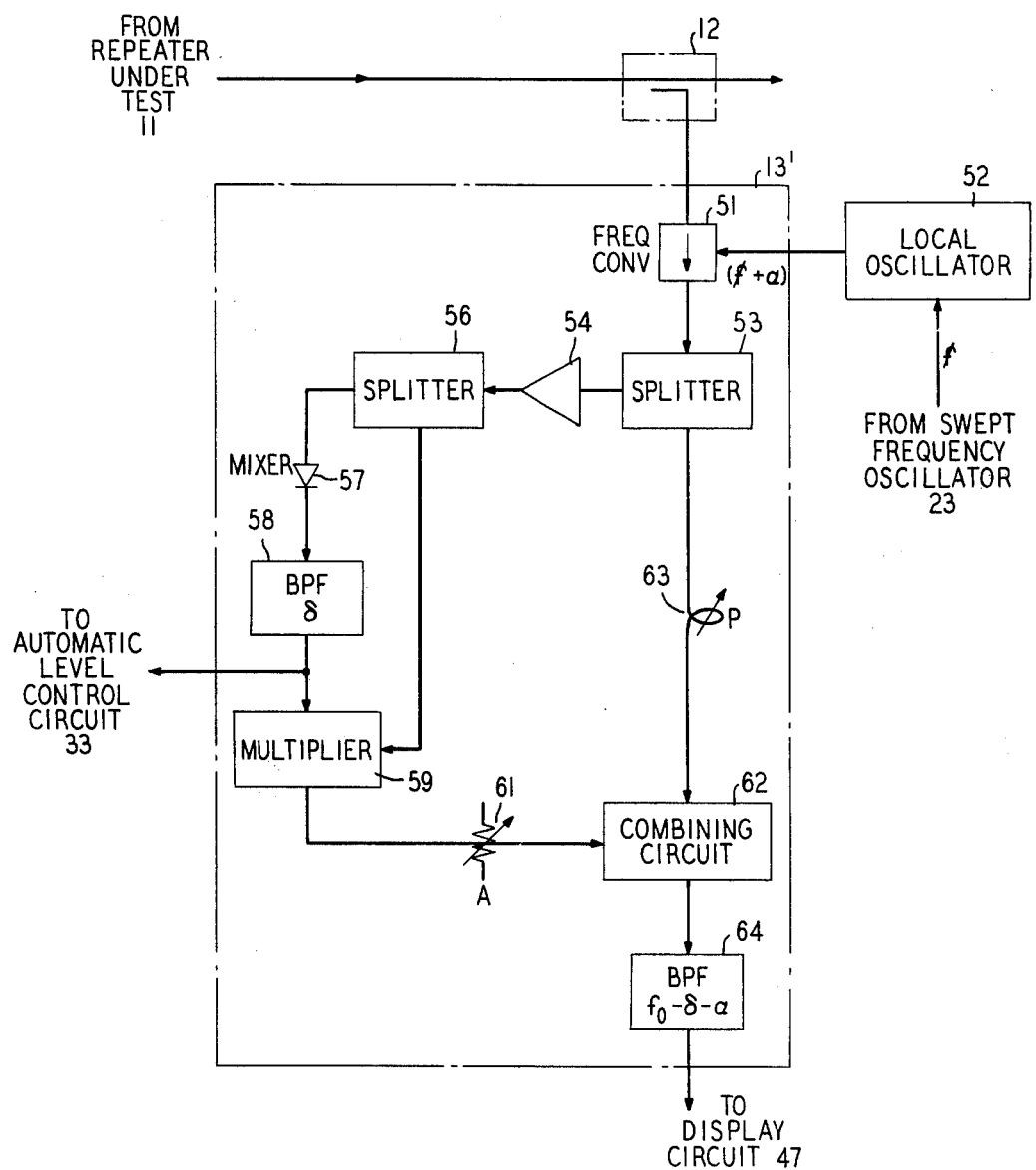
FIG. 2 is a block schematic drawing of an alternate detector arrangement for the circuit shown in FIG. 1.

The IM detector shown in FIG. 1 is used whenever the level of the test signals at the input to the detector is high enough to make its conversion loss independent of the signal level. The alternate embodiment of the invention shown in FIG. 2 is used whenever the available signal level is not sufficient.

Returning to detector 13 of FIG. 1, the output from coupler 12 is connected to a detector element 36 having predominately square law characteristics. The output of detector 36 will include a strong, second-order, distortion component of frequency $\delta$. This distortion product is produced by the mixing of the two test frequencies $(f_o + f)$ and $(f_o + \delta + f)$. The output of detector 36 will also include the desired distortion component of frequency $2\delta$. This product is produced by the mixing of the test and IM frequencies.

A signal splitter 37 is connected to the output of detector 36. A bandpass filter 38, centered about the frequency $\delta$, is connected to splitter 37 and passes the signal components of frequency $\delta$ which are present in the output of detector 36. These signal components are then amplified by an amplifier 39 and doubled in a second, non-linear detector element 41.

The other output of signal splitter 37 is passed through a phase-adjusting circuit 42 and then applied to one input of a combining circuit 43. The other input to combining circuit 43 comprises the output of non-linear detector 41, after this output signal has been passed through a variable attenuator 44.

Appropriate adjustments to attenuator 44 and phase-adjusting circuit 42 will cause the output signal of frequency $2\delta$ from circuit 41 to exactly cancel the signal of frequency 2δ which is generated by detector 36. These adjustments are made, and circuit performances checked, by applying only the two test frequencies $(f_o+f)$ and $(f_o+\delta+f)$ to the detector; that is, by connecting the output of signal source 10 directly to the input of IM detector 13, completely bypassing repeater 11.

With these adjustments made and the repeater connected back into the test circuit, any signal component of frequency 2δ which is present at the output of combining circuit 43 can only have come from the non-linear distortion generator within repeater 11. Accordingly, the output of combining circuit 43 is connected to a display circuit 47, for example an oscilloscope, via a bandpass filter 46 centered about the frequency 2δ. Advantageously, the sweep of display circuit 47 is synchronized with the sweep of oscillator 23, via lead 48 which connects to the output of sweep generator 24 in signal source 10.

The level of the signal component of frequency δ present at the output of amplifier 39 is, of course, a function of the level of the two test frequencies applied to the input of detector 13. This makes this signal component a useful tool to stabilize the output level of the repeater being tested, as is necessary if the theory underlying this testing procedure is to work. To that end, the output of amplifier 39 is also connected, via a lead 34 and a manual level control circuit 49, to the control input of automatic level control circuit 33. Thus, if the gain of repeater 11 is not linear with frequency and tends to fall as $f$ increases, for example, the level of the δ signal at the output of amplifier 39 will also fall. This, in turn, is relayed to control circuit 33 which then signals variolosser 32 to reduce the attenuation imposed on the combined test signals, in an offsetting manner.

As discussed above, when the output of the repeater under test is low and the conversion loss of detector 13 is not independent of the signal level it is preferable to use the alternate embodiment of the invention shown in FIG. 2.

As shown therein, the modified detector 13' comprises a frequency converter 51 connected to the output of coupler 12. A local oscillator 52, connected to swept frequency oscillator 23, generates a signal of frequency $(f+\alpha)$, where α is a fixed offset frequency. The replacement of detector 36 by converter 51 changes the swept frequencies to fixed frequencies, thereby rendering it possible to filter-out the desired IM frequencies, as will be explained below.

The output of frequency converter 51 is connected to a splitter 53 thence, via an amplifier 54, to a second splitter 56. The output of splitter 56 is connected to a non-linear mixer 57, thence to a bandpass filter 58 centered about the frequency δ. The output of filter 58 is connected to a multiplier stage 59 which receives as its second input the other output of splitter 56. The output of multiplier 59 is connected, via an adjustable attenuator 61, to one input of a combining circuit 62. The other input to combining circuit 62 comprises the other output of splitter 53 after passage through a variable phase-adjusting circuit 63. The output of combining circuit 62 is connected to display circuit 47 via a bandpass filter 64 centered on the frequency $(f_o-\delta-\alpha)$.

In operation, if the output of local oscillator 52 is at the frequency $(f+\alpha)$, the IM frequencies $(f_o+f-\delta)$ and $(f_o+f+2\delta)$ will be translated by converter 51 to the frequencies $(f_o-\delta-\alpha)$ and $(f_o+2\delta-\alpha)$, respectively. Either of these two translated IM frequencies can be used to determine the IM coefficient of the repeater under test. Let us assume that the frequency $(f_o-\delta-\alpha)$ will be used here.

Unfortunately, a signal component of this frequency will also be generated by fourth-order non-linearities in the frequency converter itself since:

$$2(f_o+f)-(f_o+\delta+f)-(f+\alpha) = (f_o-\delta-\alpha).$$

To cancel this unwanted term, multiplier 59 derives a signal of frequency $(f_o-\delta-\alpha)$, which signal is then combined in combining circuit 62 with the corresponding frequency component from converter 51.

More specifically, the incoming test signals of frequency $(f_o+f)$ and $(f_o+\delta+f)$ are converted in converter 51 as follows:

$$\{(f_o+f)-(f+\alpha)\} - \{(f_o+\delta+f)-(f+\alpha)\} + \{(f_o+f)-(f+\alpha)\} = (f_o-\delta-\alpha).$$

Now, it will be noted that the output of converter 51 includes the following combinations $$(f_o+f) - (f+\alpha) = f_o-\alpha$$

and $$(f_o+\delta+f) - (f+\alpha) = f_o+\delta-\alpha.$$

Non-linear device 57, however, acts as a mixer and combines $(f_o-\alpha)$ and $(f_o+\delta-\alpha)$ to generate a signal of frequency δ. Multiplier 59 then combines the δ signal and the $(f_o-\alpha)$ signal from splitter 56 to generate the desired $(f_o-\delta-\alpha)$ signal.

As before, with the test signal source connected directly to the signal detector, attenuator 61 and phase adjuster 63 are adjusted so that the signal of frequency $(f_o-\delta-\alpha)$ generated by multiplier 59 exactly cancels the corresponding signal generated by fourth-order non-linearities in converter 51. Then, with the repeater under test interposed between the source of test signals and the detector, any signal component of frequency $(f_o-\delta-\alpha)$ detected at the output of combining circuit 62 can only have come from intermodulation in the repeater under test.

The use of translated fixed frequencies to generated $(f_o-\delta-\alpha)$ will not affect the level of cancellation which is attainable, provided that the level of the $(f+\alpha)$ signal from local oscillator 52 is kept constant. As before, the signal of frequency δ from non-linear device 57 may be used to control the automatic level control circuit 33 to maintain a constant level for the test-tones at the input of the detector 13'.

It will be obvious to one skilled in the art that if one wishes to use the translated IM frequency $(f_o+2\delta-\alpha)$ rather than the frequency $(f_o-\delta-\alpha)$, all that need be done is to make appropriate changes to the tuning of bandpass filter 64.

In the illustrative embodiment, the device under test is a microwave repeater. One skilled in the art will appreciate that other active devices such as modulators, translators, etc., may also be tested for IM distortion using the technique and apparatus disclosed herein. Further, the technique disclosed herein is not restricted to microwave frequencies but may be employed with equal facility at RF, IF or even audio frequencies. Further, various changes and modifications may be made to the layout of parts shown without departing from the spirit and scope of the invention.

What I claim is:

1. Apparatus for measuring the non-linearity of a device subject to distortion, which comprises:
   means for generating a first signal of frequency $f_o$;
   means for generating a second signal of frequency $(f_o+\delta)$, where $\delta$ is an offset frequency which is small compared to the bandwidth of the device under test;
   means for generating a third signal of swept frequency $f$;
   means for combining said first, second and third signals thereby to generate first and second test signals of frequency $(f_o+f)$ and $(f_o+\delta+f)$ respectively, the frequencies $f_o$, $f$ and $\delta$ being selected such that the test signals scan the band of interest, said test signals being applied to the input of the device under test; and
   detector means, connected to the output of the device under test, for measuring the amplitude of any component in the output signal for the device under test of frequency $(f_o-\delta+f)$ or $(f_o+2\delta+f)$, said measuring means including means for cancelling any component of frequency $2\delta$ caused by distortion within the detector means itself.

2. The apparatus according to claim 1 wherein said detector means comprises:
   a first non-linear device for generating a signal of frequency $2\delta$ from said first and second test signals and the third-order IM distortion products of the device under test, said device also producing an undesired signal of frequency $2\delta$ caused by second-order distortion of the test frequencies alone;
   a signal splitter connected to the output of said first non-linear device;
   filter means connected to a first output of said signal splitter for blocking all signal components present in the output of said first non-linear device other than those of frequency $\delta$;
   a second non-linear device connected to the output of said filter means for generating a fourth signal of frequency $2\delta$; and
   means, connected to the output of said second non-linear device and to a second output of said signal splitter, for cancelling the unwanted signal component of frequency $2\delta$ generated by said first non-linear device.

3. The apparatus according to claim 2 wherein said cancelling means comprises:
   a signal combining circuit connected to the second output of said signal splitter and to the output of said second non-linear device;
   a phase-adjusting circuit intermediate said signal splitter and said signal combining circuit;
   an adjustable attenuator intermediate said second non-linear device and said signal combining circuit; and
   a bandpass filter connected to the output of said signal combining circuit, said filter rejecting all signal components other than those of frequency $2\delta$.

4. The apparatus according to claim 3 further comprising:
   means, for visually displaying the output of said bandpass filter; and
   means, connected to said third, swept-frequency, signal generating means, for synchronizing said visual display means with said swept frequency.

5. The apparatus according to claim 3 further including:
   means for automatically maintaining constant the level of the first and second test signals applied to the input by said detector means even in the presence of gain variations in the device under test.

6. The apparatus according to claim 5 wherein said level maintaining means comprises:
   means for inserting a selectively variable level of attenuation in the output signal from said first, second and third signal generating means; and
   control means, connected to and driven by the output signal of frequency $\delta$ from said bandpass filter, for controlling the attenuation inserted by said inserting means so that the level of the first and second test signals applied to the input of the device under test is altered, in an offsetting manner, as the level of the signal of frequency $\delta$ from the bandpass filter rises and falls in accordance with corresponding changes in the gain of the device under test.

7. Apparatus for measuring the non-linearity of a device subject to distortion, which comprises:
   means for generating a first signal of frequency $f_o$;
   means for generating a second signal of frequency $(f_o+\delta)$, where $\delta$ is an offset frequency which is small compared to the bandwidth of the device under test;
   means for generating a third signal of swept frequency $f$;
   means for combining said first, second, and third signals thereby to generate first and second test signals of frequency $(f_o+f)$ and $(f_o+\delta+f)$, respectively, the frequency $f_o$, $f$ and $\delta$ being selected such that the test signals scan the band of interest, said test signals being applied to the input of the device under test;
   means for generating a fourth signal of swept frequency $(f+\alpha)$, where $\alpha$ is an offset frequency which is small compared to the bandwidth of the device under test; and
   detector means, connected to the output of the device under test and to the output of said fourth signal generating means, for measuring the amplitude of a selected intermodulation product, the amplitude of said selected intermodulation product being directly proportional to the non-linearity of the device under test, said detector means further including means for cancelling any signal component of the same frequency as the intermodulation product of fixed frequency generated by fourth-order non-linearity in the output from said fourth signal generating means.

8. The apparatus according to claim 7 wherein said detector means includes a frequency converter driven by the output of said fourth signal generating means for converting the frequency of the intermodulation products in the output of the device under test to a fixed frequency $(f_o+2\delta-\alpha)$.

9. The apparatus according to claim 7 wherein said detector means includes a frequency converter driven by the output of said fourth signal generating means for converting the frequency of the intermodulation products in the output of the device under test, and said selected intermodulation product of fixed frequency has a frequency $(f_o-\delta-\alpha)$.

10. The apparatus according to claim 9 wherein said signal cancelling means comprises:
    a first signal splitter connected to the output of said frequency converter;
    a second signal splitter connected to a first output of said first signal splitter;

a non-linear device connected to a first output of said second signal splitter;

a multiplier connected to the output of said non-linear device and to a second output of said second signal splitter;

a first bandpass filter intermediate said non-linear device and said multiplier, said filter rejecting all signals from the output of said frequency converter other than of the frequency δ; and means, connected to a second output of said first signal splitter and to the output of said multiplier, for cancelling the unwanted signal component of frequency $(f_o - \delta - \alpha)$ generated by distortion in said frequency converter.

11. The apparatus according to claim 10 wherein said cancelling means comprises:

a signal combining circuit connected to the output of said multiplier and to the second output of said first signal splitter;

a phase-adjusting circuit intermediate said first signal splitter and said combining circuit;

an adjustable attenuator intermediate said multiplier and said combining circuit; and a bandpass filter connected to the output of said combining circuit, said filter rejecting all signals other than those of frequency $(f_o - \delta - \alpha)$.

12. The apparatus according to claim 11 further comprising:

means for visually displaying the output of said bandpass filter; and means, connected to said third swept frequency signal generating means, for synchronizing said visual display means with said swept frequency.

13. The apparatus according to claim 11 further including:

means for automatically maintaining constant the level of the first and second test signals applied to the input by said detector means even in the presence of gain variations in the device under test.

14. The apparatus according to claim 13 wherein said level maintaining means comprises:

means for inserting a selectively variable level of attenuation in the output signal from said first, second and third signal combining means; and control means, connected to and driven by the output signal of frequency δ from said bandpass filter, for controlling the attenuation inserted by said inserting means so that the level of the first and second test signals applied to the input of the device under test is altered, in an offsetting manner, as the level of the signal of frequency δ from the bandpass filter rises and falls in accordance with corresponding changes in the gain of the device under test.

* * * * *